US006543013B1

(12) United States Patent
Li et al.

(10) Patent No.: US 6,543,013 B1
(45) Date of Patent: Apr. 1, 2003

(54) INTRA-ROW PERMUTATION FOR TURBO CODE

(75) Inventors: Bin Li, Ottawa (CA); Wen Tong, Ottawa (CA)

(73) Assignee: Nortel Networks Limited, Quebec (CA)

( * ) Notice: Subject to any disclaimer, the term of this patent is extended or adjusted under 35 U.S.C. 154(b) by 0 days.

(21) Appl. No.: 09/291,353

(22) Filed: Apr. 14, 1999

(51) Int. Cl.[7] .................. G06F 11/00; H03M 13/00; H03M 13/03
(52) U.S. Cl. .................. 714/701; 714/762; 714/788
(58) Field of Search .................. 714/701, 702, 714/762, 761, 787, 788

(56) References Cited

U.S. PATENT DOCUMENTS

| 4,394,642 | A |   | 7/1983  | Currie et al.    |         |
|-----------|---|---|---------|------------------|---------|
| 4,907,233 | A | * | 3/1990  | Deutsch et al.   | 714/755 |
| 5,042,033 | A | * | 8/1991  | Costa            | 714/701 |
| 5,357,606 | A | * | 10/1994 | Adams            | 345/545 |
| 5,483,541 | A | * | 1/1996  | Linsky           | 714/701 |
| 5,572,532 | A | * | 11/1996 | Fimoff et al.    | 714/702 |
| 5,675,585 | A | * | 10/1997 | Bonnot et al.    | 714/701 |
| 5,742,612 | A |   | 4/1998  | Gourgue et al.   |         |
| 5,812,288 | A | * | 9/1998  | Curtis et al.    | 359/21  |
| 5,991,857 | A | * | 11/1999 | Koetje et al.    | 711/157 |
| 6,064,664 | A |   | 5/2000  | Kim              | 370/335 |
| 6,108,745 | A | * | 8/2000  | Gupta et al.     | 711/3   |
| 6,119,264 | A | * | 9/2000  | Berrou et al.    | 714/786 |
| 6,304,991 | B1| * | 10/2001 | Rowitch et al.   | 714/755 |
| 6,334,197 | B1| * | 12/2001 | Eroz et al.      | 714/701 |
| 6,347,385 | B1| * | 2/2002  | Cui et al.       | 714/701 |

FOREIGN PATENT DOCUMENTS

| EP | EP 0300139 A2 | 1/1989 |
| WO | WO 00/08770   | 2/2000 |
| WO | WO 00/10257   | 2/2000 |

OTHER PUBLICATIONS

Error Detection and Correction for Storage Members to Correct Long and Short Error Bursts Publication–Data: IBM Technical Disclosure Bulletin, Nov. 1989, US; vol. No.: 32; Issue No.: 6B; Page No.: 387–389; Publication–Date: Nov. 1, 1989.*

Blaum, M.; Bruck, J. and Vardy, A.; Interleaving schemes for multidimensional cluster errors; IEEE Transactions on Information Theory, vol.: 44 Issue: 2; Mar. 1998 pp.: 730–743.*

Raghavan, R. and Hayes, J.P.; On randomly interleaved memories; Proceedings of Supercomputing '90; pp.: 49–58.*

Shibutani, et al "Complexity Reduction of Turbo Decoding", IEEE VTS 50th Vehicular Technology Conference, vol. 3, Sep. 19–22, 1999, pp. 1570–1574.

* cited by examiner

Primary Examiner—Albert Decady
Assistant Examiner—Joseph D. Torres
(74) Attorney, Agent, or Firm—Gibbons, Del Deo, Dolan, Griffinger & Vecchione

(57) ABSTRACT

An interleaver in which a frame of data to be interleaved is stored in at least a portion of an array having R rows and C columns, the portion having $N_r^{(l)}$ rows and $N_c^{(l)}$ columns that satisfy the inequality $$N_r^{(l)} \times N_c^{(l-1)} < L < N_r^{(l)} \times N_c^{(l)}$$

where $N_c^{(l)}$ is a prime number and $N_c^{(l-1)}$ is the highest prime number less than $N_c^{(l)}$. The elements of each row are permuted according to a predetermined mathematical relationship, and the rows are permuted according to predetermined mapping.

20 Claims, 2 Drawing Sheets

INTRA-ROW PERMUTATION FOR TURBO CODE

FIELD OF THE INVENTION

This invention relates generally to communication systems and, more particularly to interleavers for performing code modulation.

BACKGROUND OF THE INVENTION

Techniques for encoding communication channels, known as coded modulation, have been found to improve the bit error rate (BER) of electronic communication systems such as modem and wireless communication systems. Turbo coded modulation has proven to be a practical, power-efficient, and bandwidth-efficient modulation method for "random-error" channels characterized by additive white Gaussian noise (AWGN) or fading. These random-error channels can be found, for example, in the code division multiple access (CDMA) environment. Since the capacity of a CDMA environment is dependent upon the operating signal to noise ratio, improved performance translates into higher capacity.

An aspect of turbo coders which makes them so effective is an interleaver which permutes the original received or transmitted data frame before it is input to a second encoder. The permuting is accomplished by randomizing portions of the signal based upon one or more randomizing algorithms. Combining the permuted data frames with the original data frames has been shown to achieve low BERs in AWGN and fading channels. The interleaving process increases the diversity in the data such that if the modulated symbol is distorted in transmission the error may be recoverable with the use of error correcting algorithms in the decoder.

A conventional interleaver collects, or frames, the signal points to be transmitted into an array, where the array is sequentially filled up row by row. After a predefined number of signal points have been framed, the interleaver is emptied by sequentially reading out the array column by column for transmission. As a result, signal points in the same row of the array that were near each other in the original signal point flow are separated by a number of signal points equal to the number of rows in the array. Ideally, the number of columns and rows would be picked such that interdependent signal points, after transmission, would be separated by more than the expected length of an error burst for the channel.

Non-uniform interleaving achieves "maximum scattering" of data and "maximum disorder" of the output sequence. Thus the redundancy introduced by the two convolutional encoders is more equally spread in the output sequence of the turbo encoder. The minimum distance is increased to much higher values than for uniform interleaving. A persistent problem for non-uniform interleaving is how to practically implement the interleaving while achieving sufficient "non-uniformity," and minimizing delay compensations which limit the use for applications with real-time requirements.

Finding an effective interleaver is a current topic in the third generation CDMA standard activities. It has been determined and generally agreed that, as the frame size approaches infinity, the most effective interleaver is the random interleaver. However, for finite frame sizes, the decision as to the most effective interleaver is still open for discussion. Decreasing the amount of memory space (RAM or ROM) needed to store the information required to carry out an interleaving scheme is also a subject of current discussion.

Accordingly there exists a need for systems and methods of interleaving codes that improve non-uniformity for finite frame sizes.

There also exists a need for such systems and methods of interleaving codes which are relatively simple to implement, including having relatively low memory space requirements.

It is thus an object of the present invention to provide systems and methods of interleaving codes that improve non-uniformity for finite frame sizes.

It is also an object of the present invention to provide systems and methods of interleaving codes which are relatively simple to implement and which have relatively low memory space requirements.

These and other objects of the invention will become apparent to those skilled in the art from the following description thereof.

SUMMARY OF THE INVENTION

The foregoing objects, and others, may be accomplished by the present invention, which includes an interleaver for interleaving these data frames. The interleaver includes a storage area containing an array large enough to store the largest expected data frame. A frame of size L elements to be interleaved is stored in $N_r^{(l)}$ rows and $N_c^{(l)}$ columns of the array, where $N_r^{(l)}$ is a predetermined integer and $N_c^{(l)}$ is a prime number which satisfy the inequality $$N_r^{(l)} \times N_c^{(l-1)} < L < N_r^{(l)} \times N_c^{(l)}$$

where $N_c^{(l-1)}$ is the highest prime number less than $N_c^{(l)}$. The elements of each row are permuted according to a predetermined mathematical relationship, and the rows are permuted according to predetermined mapping.

BRIEF DESCRIPTION OF THE DRAWINGS

The invention will be more clearly understood by reference to the following detailed description of an exemplary embodiment in conjunction with the accompanying drawings, in which.

DETAILED DESCRIPTION OF THE INVENTION

Figure 1:
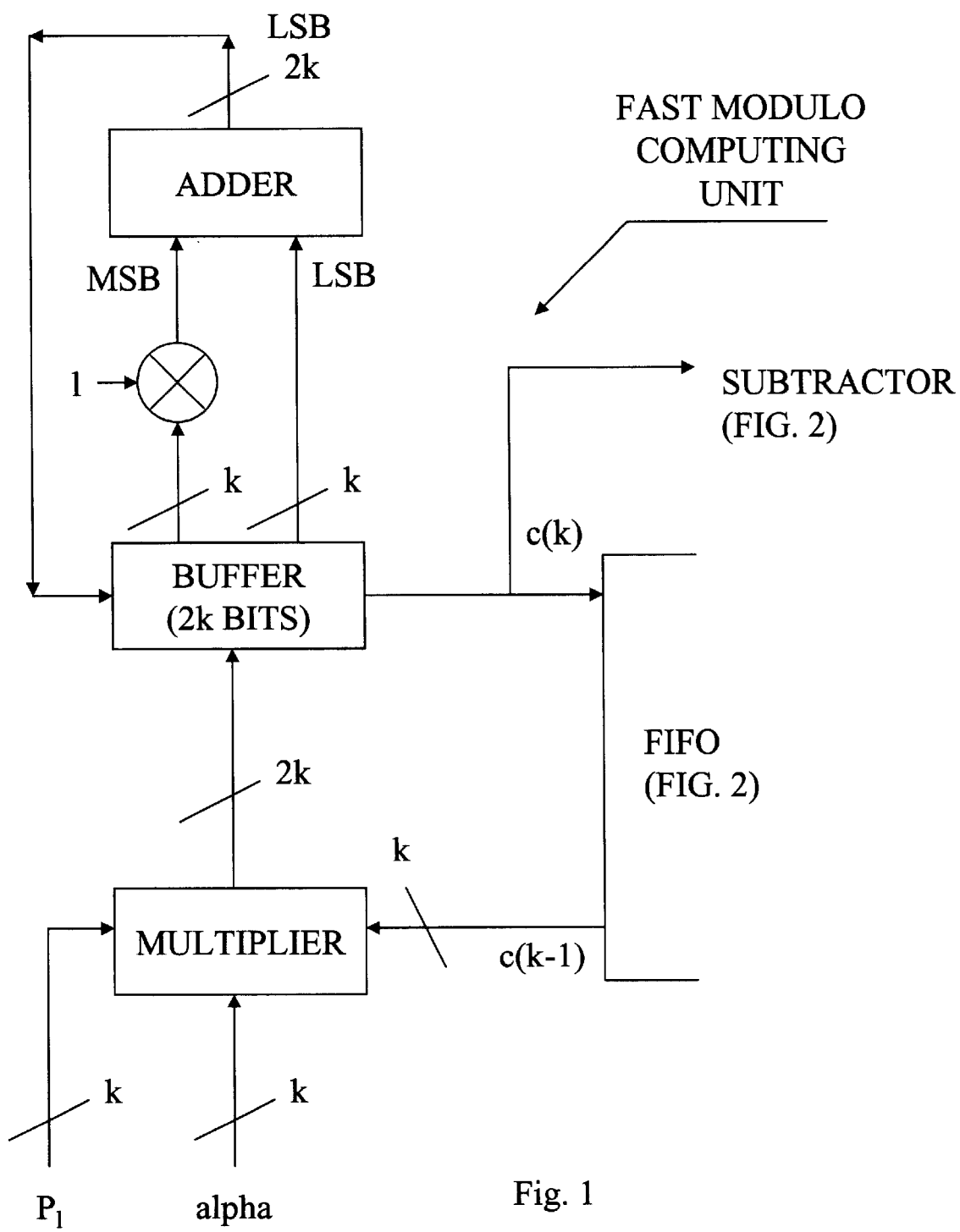
FIG. 1 depicts a fast modulo computing embodiment according to the present invention.

The present invention finds embodiment as a turbo encoder in a CDMA radio communication system. A stream of bits to be transmitted is divided into a series of frames, each frame including a number L of elements, each element being at least one bit.

Each frame is to be interleaved prior to transmission. If there are a large number of possible frame sizes L, specifying an interleaver for each possible frame size results in a necessity for storing a large number of parameters.

The invention reduces the number of parameters that must be stored by providing a reduced number of prototype interleavers (or mother interleavers), each for a one of a subset of frame sizes, selecting one of the mother interleavers at least large enough to interleave a current frame of size L, and puncturing the interleaved frame to a size of L bits.

The maximum size of an array for storing a frame to be interleaved is $N_r$ rows×$N_c$ columns. For a given frame size L, a mother interleaver is chosen having an array of size of $N_r^{(l)}$ rows×$N_c^{(l)}$ columns, such that:

$N_r^{(l)} \times N_c^{(l-1)} < L < N_r^{(l)} \times N_c^{(l)}$ and after interleaving the array is punctured to size L.

While it is possible to design a good mother interleaver with exact dimensions $N_r^{(l)} \times N_c^{(l)}$, the performance of an interleaver for a frame size punctured from the mother interleaver's size cannot, under any conventional systems, be guaranteed.

The invention provides an interleaver which can adapt to arbitrary frame size by providing a scheme for proper selection (optimization) of parameters $N_r^{(l)}$ l=1, 2, . . . R (max. no. of rows)

$N_c^{(l)}$ l=1, 2, . . . C (max. no. of columns)

In one embodiment of the invention, a fixed value is selected for the number of rows $N_r$, and the number of columns $N_c^{(l)}$ is selected from a set of prime numbers (non-uniform grid), i.; e. $N_c^{(l)} = P_l$. (In an alternative embodiment of the invention a uniform grid is employed, such as $P_l = l \times delta$.)

The core of the interleaving procedure employing the present invention generally comprises:

i) Writing the frame elements into the $N_r^{(l)} \times N_c^{(l)}$ working array row by row;

ii) Permuting the columns i of each row j according to $$c_j(i) = [\alpha_j \times c_j(i-1)] \bmod P_l \quad j=1, 2, \ldots R \quad i=1, 2, \ldots C$$

iii) Permuting the rows according to a predetermined mapping; and iv) Reading out the frame elements column by column.

The intra-row permutation (item ii) is based on a complete residual system of modulo $P_l$. That is, $\alpha_j$ is selected from all possible exponential congruent roots of $P_l$:

$$\alpha_j = \{\alpha_1, \alpha_2, \ldots \alpha_\Phi\}$$

The intra-row permutation uses a special root called the primitive root $\alpha_p$ of prime $P_l$ to construct the set of roots $\alpha_j$ by using a reduced residual system as:

$$\overline{\alpha}_j = \{\alpha_p^{p(1)}, \alpha_p^{p(2)}, \ldots \alpha_\Phi^{p(R)}\}$$

It should be noted that $\overline{\alpha}_j$ is a subset of $\alpha_j$. The advantage of using this special reduced system is to add additional constraints on the intra-row permutation roots to simplify the search computing for the parameter optimization.

For an embodiment of the invention, a set of prime numbers is chosen:

$\{p(1), p(2), \ldots p(R)\}$ under the condition that gcd $\{p(i), P_l - 1\} = 1$ (gcd connotes "greatest common denominator").

In such a case:

$$c_l(i) = [\alpha_p^{p(1)} \times c_l(i-1)] \bmod P_l$$

is equivalent to a decimated sampling (with rate sampling ratio p(l)) of the complete residual system generated by the primitive root. Therefore, the intra-row permutation may be accomplished as:

a) permuting the first row using the primitive root $\alpha_p$ of $P_l$:

$$c_l(i) = [\alpha_p^{p(1)} \times c_l(i-1)] \bmod P_l$$

and b) permuting the rest of the rows using the cyclic shift by p(j) of the first-row permutation:

$$c_j(i) = c_l([i \times p(j)]) \bmod P_l).$$

This is equivalent to the cyclic group $$c_j(i) = [\alpha_j^{p(l)} c_j(i-1)] \bmod P_l)$$

where j=2, 3, . . . R i=1, 2, . . . C.

In this case, the intra-row permutation rule is a deterministic one. The interleaver optimization is performed by searching a set of primes for cyclic shift of the primitive complete residual system. For example, if R=20 (i.e., a matrix with 20 rows and $P_l$ columns) a prime set might be chosen as p(l)={7,11,13,17,19,23,29,31,37,41,43,47,53,59,61,67, 71,73,79,83}

EXAMPLE 1

For each prime (column number) such a set is chosen. To cover a range of frame sizes from 320 bits to 8192 bits, at least 75 mother interleavers are provided. The column dimensions used for each are listed in Table 1 together with associated primitive roots. Seventy-six primes are listen in Table 1 in order to provide a value for the lowest $N_c^{(l-1)}$.

TABLE 1

| A | B | C |
|---|---|---|
| 13 | 2 | 21 |
| 17 | 3 | 21 |
| 19 | 2 | 21 |
| 23 | 5 | 21 |
| 29 | 2 | 21 |
| 31 | 3 | 21 |
| 37 | 2 | 21 |
| 41 | 6 | 21 |
| 43 | 3 | 21 |
| 47 | 5 | 2 |
| 53 | 2 | 21 |
| 59 | 2 | 3 |
| 61 | 2 | 21 |
| 67 | 2 | 21 |
| 71 | 7 | 21 |
| 73 | 5 | 21 |
| 79 | 3 | 21 |
| 83 | 2 | 6 |
| 89 | 3 | 21 |
| 97 | 5 | 21 |
| 101 | 2 | 21 |
| 103 | 5 | 21 |
| 107 | 2 | 9 |
| 109 | 6 | 21 |
| 113 | 3 | 21 |
| 127 | 3 | 21 |
| 131 | 2 | 21 |
| 137 | 3 | 21 |
| 139 | 2 | 2 |
| 149 | 2 | 5 |
| 151 | 6 | 21 |
| 157 | 5 | 21 |
| 163 | 2 | 21 |
| 167 | 5 | 16 |
| 173 | 2 | 7 |
| 179 | 2 | 17 |
| 181 | 2 | 21 |
| 191 | 19 | 1 |
| 193 | 5 | 21 |
| 197 | 2 | 21 |
| 199 | 3 | 21 |
| 211 | 2 | 21 |
| 223 | 3 | 5 |
| 227 | 2 | 21 |
| 229 | 6 | 1 |
| 233 | 3 | 3 |
| 239 | 7 | 21 |
| 241 | 7 | 21 |
| 251 | 6 | 21 |
| 257 | 3 | 21 |

TABLE 1-continued

| A | B | C |
|---|---|---|
| 263 | 5 | 21 |
| 269 | 2 | 12 |
| 271 | 6 | 21 |
| 277 | 5 | 2 |
| 281 | 3 | 21 |
| 283 | 3 | 8 |
| 293 | 2 | 14 |
| 307 | 5 | 21 |
| 311 | 17 | 4 |
| 313 | 10 | 21 |
| 317 | 2 | 15 |
| 331 | 3 | 21 |
| 337 | 10 | 21 |
| 347 | 2 | 21 |
| 349 | 2 | 3 |
| 353 | 3 | 21 |
| 359 | 7 | 21 |
| 367 | 6 | 11 |
| 373 | 2 | 4 |
| 379 | 2 | 21 |
| 383 | 5 | 21 |
| 389 | 2 | 18 |
| 397 | 5 | 21 |
| 401 | 3 | 21 |
| 409 | 21 | 21 |
| 419 | 2 | 1 |

(A = prime number $N_c^{(1)}$;
B = primitive root $\alpha_p$;
C = puncture)

In a practice of the present invention, the storage requirement for the set of primitive roots is reduced by using a set of twenty-one consecutive primes (in the present example (Example 1), adding the prime 89 to the exemplary twenty primes p(l) given above).

There is then at most one number that does not satisfy gcd $\{p(i),P_l-1\}=1$.

In a case where such a number occurs, it is punctured from p(l) set. In a case where all primes in p(l) satisfy such a condition, the last (twenty-first) prime (89 in the current example (Example 1)) is punctured. Thus, for each prime given in Table 1 (column A), there is also given the primitive root column B) and the position which should be punctured (column C). The memory requirement for the data given in Table 1 is:

Prime Numbers: 589 bits

Primitive Roots: 159 bits

Puncture Pattern: 322 bits

Prime Set p(l): 120 bits

Total: 1190 bits or 149 bytes.

A practice of the invention based on fast modulo puting will now be described:

Any prime number P can be described by the condition:

$$P=2^k-l.$$

Given any number x<P, the following decomposition applies:

$$x=m\times 2^k+c=m\times(2^k-l)+lm+c=m\times p+lm+c$$

Therefore:

$$[x]\mathrm{mod}P=[lm+c]\mathrm{mod}P \quad [\text{Eq. 1}]$$

and the modulo value can be computed in such a recursive fashion. (In the special case that l=1, only a single iteration is required.)

Since $\alpha<P$, and thus $\alpha\times(k)<P^2$, a multiplier may be employed that is 2 kbits in width. Also:

$$\log_2[m]<k \text{ and } \log_2[c]<k.$$

The modulo P value can be computed according to Eq. 1 by multiplying a k-bit LSB with 1 and then adding a k-bit MSB. If the sum is more than k bits wide, Eq. 1 must be reinvoked, i.e.:

$$[lm+c]\mathrm{mod}P=[m'+c']\mathrm{mod}P=m'+c'.$$

In the extreme case:

$$m=\{111\ldots 1\}_{k\ bits}$$

and $$c=\{111\ldots 1\}_{k\ bits},$$

and thus $$m'=\{1\}_{l\ bit}$$

and $$c'=\{111\ldots 10\}_{k\ bits}.$$

Hence, $$\log_2[c'=m']<k.$$

Figure 2:
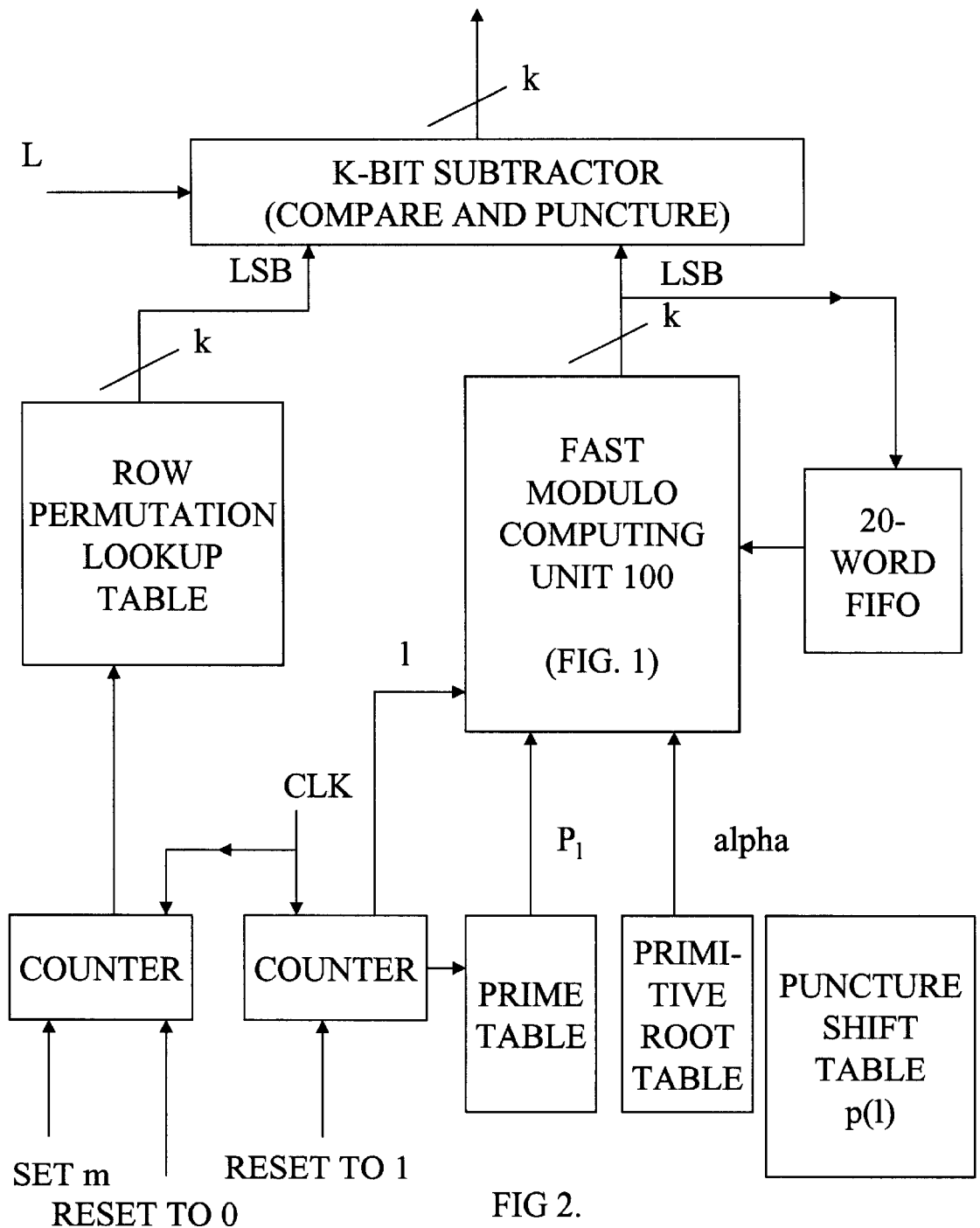
FIG. 2 depicts the structure of an interleaver according to the present invention.

An embodiment of the modulo P calculation presented here is depicted in FIG. 1. An overall embodiment of the interleaver presented here is depicted in FIG. 2.

The interleaver parameters are to be selected according to the given intra-row congruential rule. It is known that once the recursive convolutional code (RCC) constituent code is determined, error performance is characterized by the input and output weight of error events of the constituent decoders. (The input weight is the number of bit errors.) It is known that the performance Turbo codes at high SNR is dictated by output error events with input weight 2. The effective free distance is the minimum output weight of all error events of input weight 2. A key to optimizing the interleaver parameters is to identify parameter sets which minimize low-weight error events, with the patterns shown in Table 3 as criteria.

TABLE 2

| Weight-2 $1 + D^i$ | | Weight-3 $1 + D^i + D^j$ | | Weight-4 $1 + D^i + D^j + D^k$ | |
|---|---|---|---|---|---|
| len. | i | len. | i, j | len. | i, j, k |
| 8 | 7 | 4 | 2, 3 | 7 | 1, 3, 6 |
| 15 | 14 | 6 | 1, 5 | 10 | 1, 4, 9 |
| 22 | 21 | 7 | 4, 6 | 5 | 1, 2, 4 |
| 29 | 28 | 9 | 5, 8 | 11 | 1, 6, 10 |
| | | 10 | 3, 9 | 9 | 1, 7, 8 |
| | | 11 | 2, 10 | 12 | 1, 2, 11 |
| | | 11 | 9, 10 | 9 | 2, 4, 8 |
| | | 12 | 6, 11 | 7 | 2, 5, 6 |
| | | 13 | 1, 12 | 10 | 2, 7, 9 |
| | | 13 | 8, 12 | 6 | 3, 4, 5 |
| | | 14 | 4, 13 | 11 | 3, 7, 10 |
| | | 14 | 11, 13 | 10 | 4, 8, 9 |
| | | 16 | 5, 15 | 12 | 4, 7, 11 |
| | | 16 | 12, 15 | 12 | 5, 10, 11 |
| | | | | 12 | 8, 9, 11 |

For example, if an input pattern has weight-2 (e.g., two 1 bits with six 0's between them, then according to the Weight-2 column of Table 3 a set of interleaver parameters is sought that produce an output with 1 bits in the zero'th (initial) and seventh, fourteenth, twenty-first, or twenty-eight positions (according to length) with six, thirteen, twenty, or twenty-seven 0 bits, respectively, between the two one bits. This may be expressed as verifying 1 bits in zero'th and i'th positions.

In similar application of this "low-weight filtering technique", weight-3 streams are checked for 1 bits in the zero'th, i'th, and j'th positions. Weight-4 streams are checked for 1 bits in the zero'th i'th, j'th, and k'th positions.

Although the embodiment described above is a turbo encoder such as is found in a CDMA system, those skilled in the art realize that the practice of the invention is not limited thereto and that the invention may be practiced for any type of interleaving and de-interleaving in any communication system.

It will thus be seen that the invention efficiently attains the objects set forth above, among those made apparent from the preceding description. In particular, the invention provides improved apparatus and methods of interleaving codes of finite length while minimizing the complexity of the implementation and the amount of storage space required for parameter storage.

It will be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween. Having described the invention, what is claimed as new and secured by Letters Patent is:

What is claimed is:

1. A method of interleaving elements of frames of data, the method comprising:

providing a storage array c of R rows and C columns, where R and C are positive integers;

storing a frame of data comprising a plurality L of elements in a working array within the storage array c, the working array having $N_r^{(l)}$ rows and $N_c^{(l)}$ columns, where:

$N_r^{(l)}$ is a positive integer no greater than R;

$N_c^{(l)}$ is a prime number no greater than C; and $$N_r^{(l)} \times N_c^{(l-1)} < L < N_r^{(l)} \times N_c^{(l)};$$

where $N_c^{(l-1)}$ is the highest prime number less than $N_c^{(l)}$, and for each row of the storage array c, permuting the elements of the row according to a predetermined mathematical relationship.

2. The method according to claim 1 wherein the predetermined mathematical relationship for permuting the elements of each row of the storage array c is:

$$c_j(i) = [\alpha_j \times c_j(i-1)] \bmod P_l$$

where:

j=1, 2, ... R;

i=1, 2, ... C;

P is a set of contiguous prime numbers;

$P_l$ is equal to $N_c^{(l)}$; and, $\alpha_j$ is selected from exponential congruent roots of $P_l$.

3. The method according to claim 2 further comprising permuting the rows of the storage array c according to predetermined mapping.

4. The method according to claim 3 further comprising storing said frame of data in row-by-row order, and reading out said frame of data after permutation in column-by-column order.

5. The method according to claim 2 wherein the values of $\alpha_j$ are selected from exponential congruent roots of $P_l$ according to $$\alpha_j = \{\alpha_p^{P(1)}, \alpha_p^{P(2)}, \ldots \alpha_p^{P(R)}\}$$

where:

$\alpha_p$ is the primitive root of $P_l$; and gcd $\{p(i), P_l-1\}=1$.

6. The method according to claim 2 wherein the values of $\alpha_j$ are selected from among j+1 values by eliminating a value for which gcd $\{p(i), P_l-1\}$ is not equal to 1.

7. The method according to claim 2 wherein:

the values of $\alpha_j$ are selected from among values found to produce minimum bit errors with low-weight input data.

8. The method according to claim 2, wherein the values of $\alpha_j$ associated with each value of $N_c^{(l)}$ are precomputed and stored.

9. An interleaver for interleaving elements of frames of data, the interleaver comprising:

a memory containing at least a storage array c of R rows and C columns, where R and C are positive integers;

a memory read-write circuit storing a frame of data comprising a plurality L of elements in a working array within the storage array c, the working array having $N_r^{(l)}$ rows and $N_c^{(l)}$ columns, where:

$N_r^{(l)}$ is a positive integer no greater than R;

$N_c^{(l)}$ is a prime number no greater than C; and $$N_r^{(l)} \times N_c^{(l-1)} < L < N_r^{(l)} \times N_c^{(l)};$$

where $N_c^{(l-1)}$ is the highest prime number less than $N_c^{(l)}$, and an ALU adapted, for each row of the storage array c, to permute the elements of the row according to a predetermined mathematical relationship.

10. The interleaver according to claim 9 wherein the ALU is adapted to permute the elements of each row of the storage array c according to:

$$c_j(i) = [\alpha_j \times c_j(i-1)] \bmod P_l$$

where:

j=1, 2, ... R;

i=1, 2, ... C;

P is a set of contiguous prime numbers;

$P_l$ is equal to $N_c^{(l)}$; and $\alpha_j$ is selected from exponential congruent roots of $P_l$.

11. The interleaver according to claim 10 wherein the ALU permutes the rows of the storage array c according to predetermined mapping.

12. The interleaver according to claim 11 wherein the memory read-write circuit stores said frame of data in row-by-row order, and reads out said frame of data after permutation in column-by-column order.

13. The interleaver according to claim 10 wherein the ALU selects the values of $\alpha_j$ from exponential congruent roots of $P_l$ according to $$\alpha_j = \{\alpha_p^{P(1)}, \alpha_p^{P(2)}, \ldots \alpha_p^{P(R)}\}$$

where:

$\alpha_p$ is the primitive root of $P_l$; and gcd $\{p(i), P_l-1\}=1$.

14. The interleaver according to claim 10 wherein the ALU selects the values of $\alpha_j$ from among j+1 values by eliminating a value for which gcd $\{p(i), P_l-1\}$ is not equal to 1.

15. An interleaver for interleaving elements of frames of data, the interleaver comprising:

memory means containing at least a storage array c of R rows and C columns, where R and C are positive integers;

memory read-write means for storing a frame of data comprising a plurality L of elements in a working array within the storage array c, the working array having $N_r^{(l)}$ rows and $N_c^{(l)}$ columns, where:

$N_r^{(l)}$ is a positive integer no greater than R;

$N_c^{(l)}$ is a prime number no greater than C; and $$N_r^{(l)} \times N_c^{(l-1)} < L < N_r^{(l)} \times N_c^{(l)};$$

where $N_c^{(l-1)}$ is the highest prime number less than $N_c^{(l)}$, and logic means for permuting, for each row of the storage array c, the elements of the row according to a predetermined mathematical relationship.

16. The interleaver according to claim 15 wherein the logic means is permutes the elements of each row of the storage array c according to:

$$c_j(i) = [\alpha_j \times c_j(i-1)] \bmod P_l$$

where:

j=1, 2, ... R;

i=1, 2, ... C;

P is a set of contiguous prime numbers;

$P_l$ is equal to $N_c^{(l)}$; and $\alpha_j$ is selected from exponential congruent roots of $P_l$.

17. The interleaver according to claim 16 wherein the logic means permutes the rows of the storage array c according to predetermined mapping.

18. The interleaver according to claim 17 wherein the memory read-write means stores said frame of data in row-by-row order, and reads out said frame of data after permutation in column-by-column order.

19. The interleaver according to claim 16 wherein the logic means selects the values of $\alpha_j$ from exponential congruent roots of $P_l$ according to $$\alpha_j = \{\alpha_p^{p(1)}, \alpha_p^{p(2)}, \ldots \alpha_p^{p(R)}\}$$

where:

$\alpha_p$ is the primitive root of $P_l$; and gcd $\{p(i), P_l-1\}=1$.

20. The interleaver according to claim 16 wherein the logic means selects the values of $\alpha_j$ from among j+1 values by eliminating a value for which gcd $\{p(i), P_l-1\}$ is not equal to 1.

* * * * *